(12) United States Patent
Benke

(10) Patent No.: US 11,004,620 B2
(45) Date of Patent: May 11, 2021

(54) CIRCUIT INTERRUPTER AND METHOD OF DETERMINING CONTACT WEAR BASED UPON TEMPERATURE

(71) Applicant: EATON INTELLIGENT POWER LIMITED, Dublin (IE)

(72) Inventor: James Jeffery Benke, Pittsburgh, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 163 days.

(21) Appl. No.: 16/355,963

(22) Filed: Mar. 18, 2019

(65) Prior Publication Data
US 2020/0303138 A1    Sep. 24, 2020

(51) Int. Cl.
*G01J 5/58*     (2006.01)
*H01H 1/00*   (2006.01)
(Continued)

(52) U.S. Cl.
CPC .............. *H01H 1/0015* (2013.01); *G01J 5/58* (2013.01); *G01R 31/3274* (2013.01);
(Continued)

(58) Field of Classification Search
USPC ........................................ 361/170, 179, 180
See application file for complete search history.

(56) References Cited

U.S. PATENT DOCUMENTS 6,023,036 A    2/2000 Nichols
6,231,227 B1 *  5/2001 Andersen ............. H01H 1/0015
374/4
(Continued)

FOREIGN PATENT DOCUMENTS

| | | |
|---|---|---|
| EP | 0 193 732 A1 | 9/1986 |
| EP | 2 579 289 A2 | 10/2013 |
| WO | 00/39823 A1 | 7/2000 |

OTHER PUBLICATIONS

European Patent Office, "Partial International Search Report for corresponding International (PCT) Application No. PCT/EP2020/025131", dated Jun. 22, 2020, 12 pp.

*Primary Examiner* — Danny Nguyen
(74) *Attorney, Agent, or Firm* — Eckert Seamans Cherin & Mellott, LLC

(57) ABSTRACT

A circuit interrupter includes a temperature detection system that is configured to detect a measured temperature of at least one of a line conductor, a load conductor, a movable contact, and a stationary contact during operation of the circuit interrupter. The measured temperature is representative of an extent of wear of the set of separable contacts. In one embodiment the temperature detection system includes a temperature sensor that is an infrared sensor. In another embodiment, the temperature detection system includes a temperature sensor that is in physical contact with an electrically conductive structure within the circuit interrupter and therefore additionally employs a voltage filter that filters a line voltage from the signal from the temperature sensor. In another embodiment, the temperature detection system employs a temperature sensor that is in physical contact with an electrically conductive structure, but a wireless transceiver is used to wirelessly communicate the measured temperature.

11 Claims, 4 Drawing Sheets

(51) Int. Cl.
*G01R 31/327* (2006.01)
*H02H 1/00* (2006.01)
*G01N 25/72* (2006.01)

(52) U.S. Cl.
CPC ............... *H02H 1/00* (2013.01); *G01N 25/72* (2013.01); *G01R 31/327* (2013.01)

(56) References Cited

U.S. PATENT DOCUMENTS

2003/0174453 A1* 9/2003 Hsu .................. H02H 3/08
 361/78
2006/0119344 A1* 6/2006 Benke ................ H02H 5/04
 324/126
2008/0088991 A1* 4/2008 Elms ................ H01H 71/162
 361/42

* cited by examiner

CIRCUIT INTERRUPTER AND METHOD OF DETERMINING CONTACT WEAR BASED UPON TEMPERATURE

BACKGROUND

Field

The disclosed and claimed concept relates generally to circuit interrupters and, more particularly, to a circuit interrupter having a temperature sensor that detects a temperature which is representative of an operational temperature of a set of movable contacts and from which an extent of wear of the set of contacts can be determined, and a related method.

Related Art

Circuit interrupters are known to be used in any of a wide variety of applications wherein it is desirable to protect at least a portion of a circuit from various predetermined conditions such as over-current conditions, under-voltage conditions, ground fault conditions, and other conditions, without limitation. It is understood that such circuit interrupters typically include for each pole a set of separable contacts that are movable from a CLOSED position to an OPEN position in the event that it is desired to open the circuit, such as in the event of one of the aforementioned predetermined conditions or other conditions. Such circuit interrupters typically additionally include a trip unit which when triggered, moves each such set of separable contacts from the CLOSED positions to the OPEN position. While such circuit interrupters have generally been effective for their intended purposes, they have not been without limitation.

Each time the circuit interrupter is moved from the CLOSED position to the OPEN position, an electrical arc is temporarily formed between the stationary contact and the movable contact that is moving away from the stationary contact. Such electrical arc is desirably distinguished as soon as possible because the arc causes vaporization of the metal that forms the opposing surfaces of the set of separable contacts. Such vaporization of material from the contacts can be characterized as wear of the contacts, and such wear is generally undesirable. As the opposing surfaces of the contacts undergo wear, the quality of the electrical connection that is formed between the engaged opposing surfaces of the contacts decreases, which is undesirable. Improvements thus would be desirable.

SUMMARY

An improved circuit interrupter includes a temperature detection system that is configured to detect a measured temperature of at least one of a line conductor, a load conductor, a movable contact, and a stationary contact during operation of the circuit interrupter. The measured temperature is representative of an operational temperature of the set of separable contacts, and the operational temperature is representative of an extent of wear of the set of separable contacts. In one embodiment the temperature detection system includes a temperature sensor that is an infrared sensor and which detects the measured temperature without being in physical contact with an electrically conductive structure of the circuit interrupter. In another embodiment, the temperature detection system includes a temperature sensor that is in physical contact with an electrically conductive structure within the circuit interrupter and therefore additionally employs a voltage filter that filters a line voltage from the signal that is output from the temperature sensor in order that the temperature component of the signal can be distinguished from the line voltage. In still another embodiment, the temperature detection system employs a temperature sensor that is in physical contact with an electrically conductive structure of the circuit interrupter, but a wireless transceiver is used to wirelessly communicate to another wireless transceiver a signal that is representative of the measured temperature.

As such, an aspect of the disclosed and claimed concept is to provide an improved circuit interrupter that includes a temperature detection system that detects a measured temperature of an electrically conductive structure of the circuit interrupter, with the measured temperature being representative of an operational temperature of a set of separable contacts of the circuit interrupter, the operational temperature being representative of an extent of wear of the set of separable contacts.

Another aspect of the disclosed and claimed concept is to provide an improved method of determining an extent of wear of a set of separable contacts of such a circuit interrupter by detecting a measured temperature that is representative of an operational temperature of the set of separable contacts, and employing the measured temperature to determine the extent of wear of the set of separable contacts.

Accordingly, an aspect of the disclosed and claimed concept is to provide an improved circuit interrupter, the general nature of which can be stated as including a housing, a first conductor situated on the housing, a second conductor situated on the housing, a set of separable contacts that can be generally stated as including a movable contact electrically connected with the first conductor and a stationary contact electrically connected with the second conductor, a trip unit connected with the movable contact and structured to move the set of separable contacts between a CLOSED condition and an OPEN condition, and a temperature detection system that can be generally stated as including a temperature sensor that is structured to detect a temperature of at least one of the first conductor, the second conductor, the movable contact, and the stationary contact.

Another aspect of the disclosed and claimed concept is to provide an improved method of determining an extent of wear of a set of separable contacts of a circuit interrupter, the set of separable contacts being movable between a CLOSED condition and an OPEN condition and including a movable contact and a stationary contact. The method can be generally stated as including detecting a measured temperature that is representative of an operational temperature of at least one of the movable contact and the stationary contact, and employing the measured temperature to determine the extent of wear of the set of separable contacts.

Another aspect of the disclosed and claimed concept is to provide an improved circuit interrupter, the general nature of which can be stated as including a housing, a first conductor situated on the housing, a second conductor situated on the housing, a set of separable contacts that can be generally stated as including a movable contact electrically connected with the first conductor and a stationary contact electrically connected with the second conductor, a trip unit connected with the movable contact and structured to move the set of separable contacts between a CLOSED condition and an OPEN condition and a temperature detection system that can be generally stated as including a temperature sensor and a processor apparatus, the temperature sensor being structured to detect a temperature of at least one of the first conductor, the second conductor, the movable contact, and the stationary contact, the processor apparatus can be generally stated as including a processor and a storage, the storage having stored therein a number of routines which, when executed on the processor, cause the circuit interrupter to perform operations that can be generally stated as including, making a determination that the temperature has exceeded a predetermined value and, responsive to the making of the determination, generating an output.

BRIEF DESCRIPTION OF THE DRAWINGS

A further understanding of the disclosed and claimed concept can be gained from the following Description when read in conjunction with the accompanying drawings in which:

Similar numerals refer to similar parts throughout the specification.

DESCRIPTION

Figure 1:
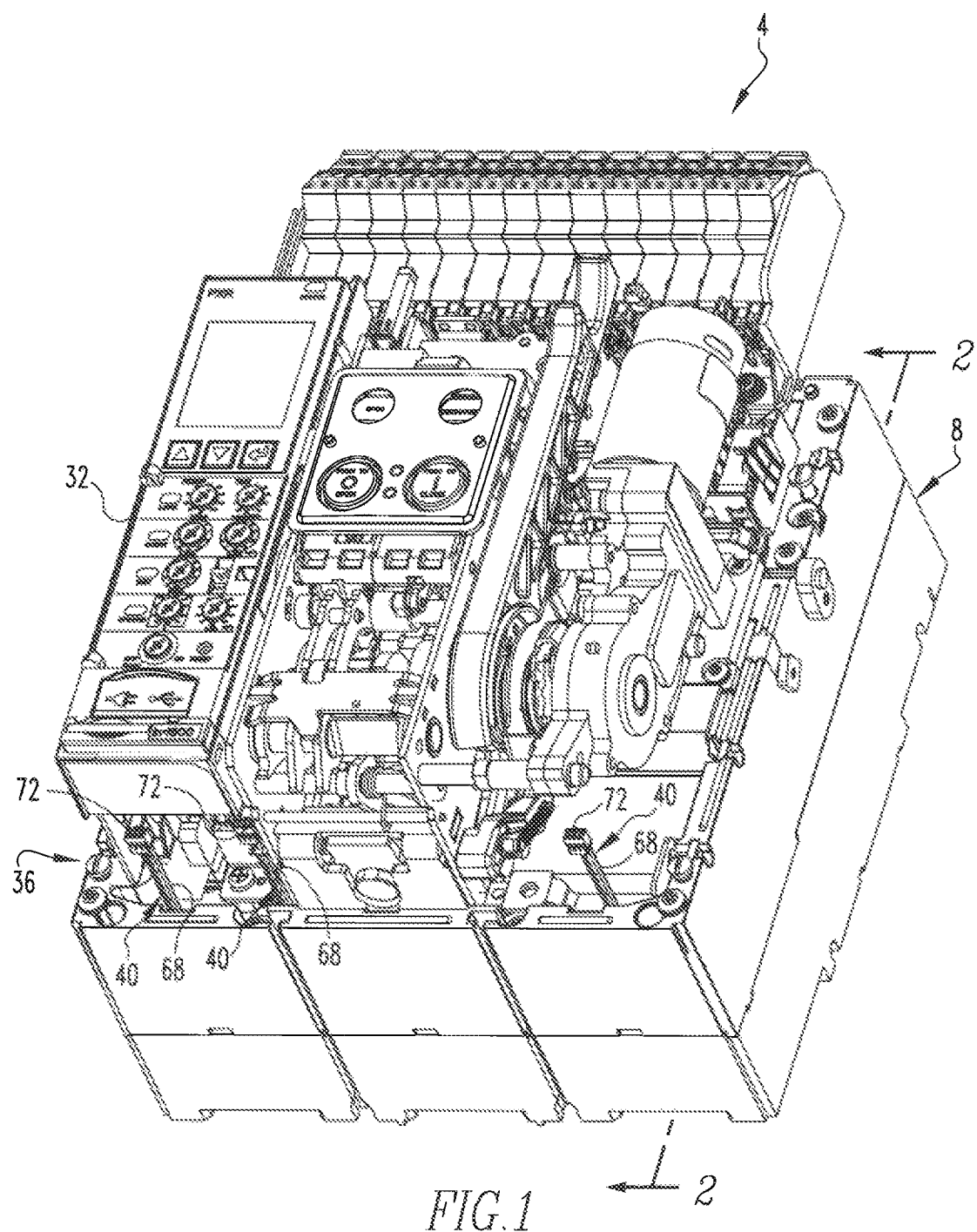
FIG. 1 is a perspective view of an improved circuit interrupter in accordance with a first embodiment of the disclosed and claimed concept having a temperature detection system that is likewise in accordance with the disclosed and claimed concept.
Figure 2:
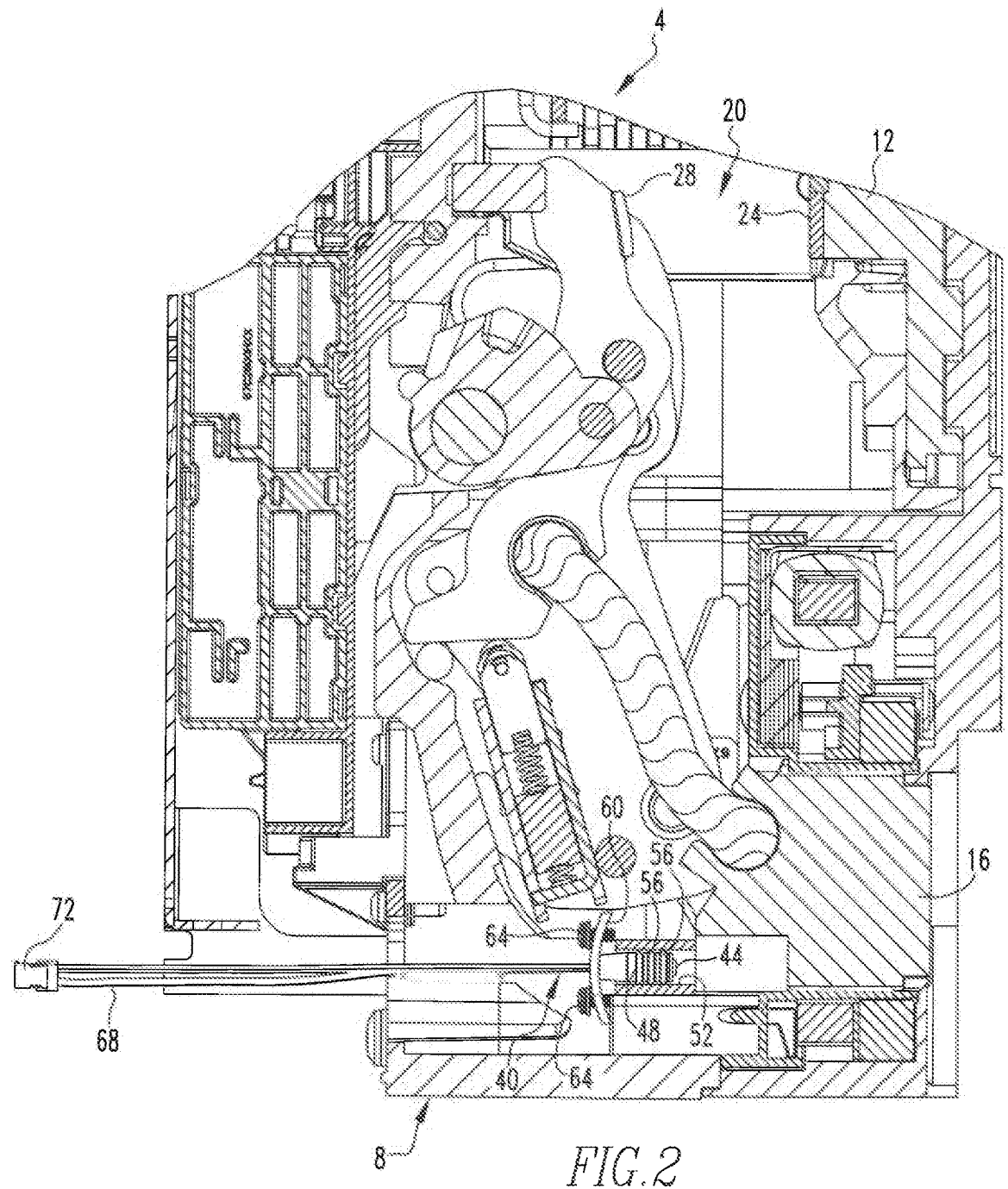
FIG. 2 is a partial sectional view as taken along line 2-2 of FIG. 1.

An improved circuit interrupter 4 in accordance with a first embodiment of the disclosed and claimed concept is depicted generally in FIG. 1 and is depicted in partial section in FIG. 2. The circuit interrupter 4 includes three poles, i.e., one for each of three phases of electrical power. It is noted, however, that only one of the three poles is described in detail herein inasmuch as the other two poles are set up in a similar fashion, function in a similar fashion, and are mechanically linked together to simultaneously operate between a CLOSED position and an OPEN position.

The circuit interrupter 4 includes a housing 8 which is depicted in FIG. 1 as having a cover portion thereof removed in order to better depict the internals. As is best shown in FIG. 2, the circuit interrupter 4 further includes a first conductor 12, a second conductor 16, and a set of separable contacts 20 that are electrically interposed between the first and second conductors 12 and 16, all of which are situated on the housing 8. The first and second conductors 12 and 16 and the set of separable contacts 20 together form a set of electrically conductive structures that form a conductive path in a CLOSED position of the set of electrical contacts 20 that is connectable with a line conductor and a load conductor in order to provide electrical power to a protected portion of a circuit.

As can be seen in FIG. 2, the set of separable contacts include a stationary contact 24 that is electrically connected with the second conductor 16. The set of separable contacts 20 further include a movable contact 28 that is electrically connected with the first conductor 12. The set of separable contacts 20 are depicted in FIG. 2 in an OPEN position, it being understood that the set of separable contacts 20 are movable between the aforementioned OPEN position and the CLOSED position wherein the stationary and movable contacts 24 and 28 are physically engaged with one another to thereby electrically connect themselves together.

The circuit interrupter 4 further includes a trip unit 32 that is situated on the housing 8 and that is operable to trigger the set of separable contacts 20 to move between the CLOSED position and the OPEN position. In a known fashion, the trip unit 32 is configured to move the set of separable contacts 20 from the CLOSED position to the OPEN position responsive to any of a variety of predetermined conditions such as over-current conditions, under-voltage conditions, ground fault conditions, and the like without limitation.

Figure 3:
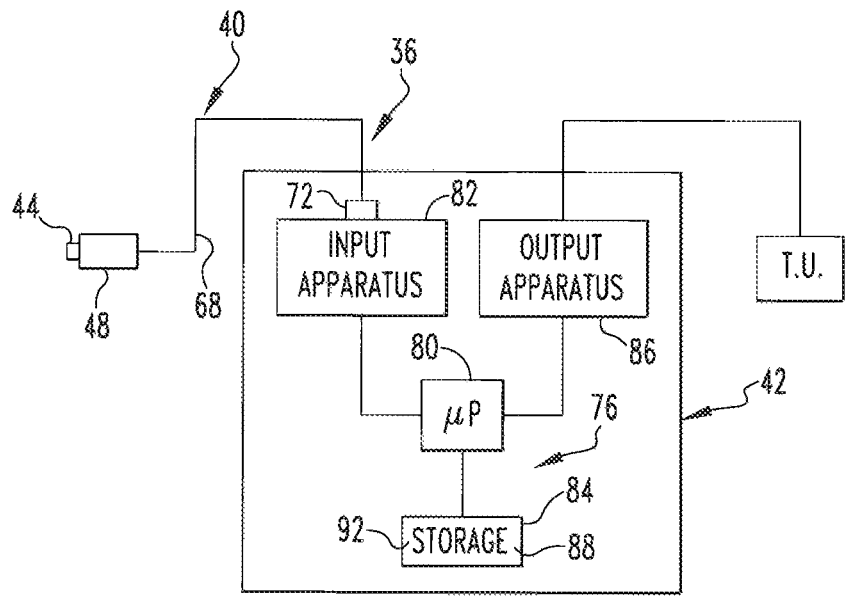
FIG. 3 is a schematic depiction of a processor apparatus of the temperature detection system of the circuit interrupter of FIG. 1.

The circuit interrupter 4 advantageously further includes a temperature detection system 36 (FIG. 1) that is situated on the housing 8. The temperature detection system 36 includes a sensor apparatus 40 (FIG. 2) and a data apparatus 42 (FIG. 3). As is best shown in FIG. 2, the sensor apparatus 40 includes a temperature sensor 44 that is carried by a boot 48 that is receivable in a receptacle 52 that is formed in the housing 8. In the depicted exemplary embodiment, the temperature sensor 44 is an infrared temperature sensor that detects a temperature without needing to be in physical contact with the object whose temperature is being detected. The boot 48 is formed of a resilient material and includes a number of resilient protrusions 56 that are engageable with the surface of the receptacle 52 to retain the boot 48 and the sensor 44 in a particular position within the receptacle 52. As employed herein, the expression "a number of" and variations thereof shall refer broadly to any non-zero quantity, including a quantity of one. The sensor apparatus 40 further includes a plate 60 that is of an arcuate shape and a pair of screws 64 that are receivable through holes in the plate 60 in order to mount the plate 60 to the housing 8. The arcuate shape of the plate 60 enables a compressive load to be placed on the boot 48 to retain the boot 48 and the temperature sensor 44 with a compressive force within the receptacle 52. The sensor apparatus 40 further includes a wire harness 68 that extends from the temperature sensor 44 and a connector 72 that is electrically connected with the wire harness 68 opposite the temperature sensor 44. The connector 72 is, in the depicted exemplary embodiment, connected with the data apparatus 42.

The data apparatus 42 can be said to include a processor apparatus 76 that includes a processor 80 and a storage 84. The processor 80 can be any of a wide variety of processors, including a microprocessor or the like without limitation. The storage 84 can be any of a wide variety of electronic storage devices such as RAM, ROM, EPROM, FLASH, and the like without limitation and functions as a machine readable storage medium in the form of an internal storage area of a computer. The storage 84 has a number of routines 88 stored therein which, when executed on the processor 80, cause the circuit interrupter 4 to perform various operations such as those that are set forth herein. The storage 84 further has a number of data tables 92 stored therein which contain data values that are retrievable by one of the routines 88. The data apparatus 42 further includes an input apparatus 82 that provides input signals to the processor 80. The data apparatus 42 also includes an output apparatus 86 that receives output signals from the processor 80.

The temperature sensor 44 is advantageously configured to detect the temperature of the second conductor 16. Since the second conductor 16 is electrically connected with the stationary contact 24, resistance heat generated between the stationary and movable contacts 24 and 28 during operation of the circuit interrupter 4, i.e., while supplying electrical power to an electrical load, is thermally conducted from the set of separable contacts 20 into and through both the first conductor 12 and the second conductor 16. Since heat within the first and second conductors 12 and 16 likely will be lost to the surrounding atmosphere and elsewhere via convection and the like, the temperature sensor 44 will desirably be placed relatively close to the point of physical connection between the set of stationary contacts 20 in order to most accurately reflect the actual operational temperature of the set of stationary contacts 20. It can be understood, however, that regardless of the particular location of whichever of the aforementioned conductive structures whose temperature the temperature sensor 44 is configured to detect, the data tables 92 are constructed such that an operational temperature of the set of separable contacts 20 corresponds with the measured temperature. And, the corresponding operational temperature of the set of separable contacts 20 can be retrieved from the data tables 92 based upon a detected measured temperature that has been measured by the temperature sensor 44. That is, the temperature sensor 44 detects a measured temperature of whatever portion of the first conductor 12, the second conductor 16, the stationary contact 24, or the movable contact 28 the temperature sensor 44 is configured to detect, and a signal that is representative of the measured temperature is provided to the input apparatus 82 which provides an input to the processor 80 which retrieves from the data tables 92 a corresponding operational temperature of the set of separable contacts 20.

Depending upon the operational temperature that has been retrieved from the data tables 92 and, optionally, the duration of time that the routines 88 determine that the operational temperature has existed at the set of separable contacts, the routines 88 trigger an output to be generated by the output apparatus 86. For instance, the routines 88 may determine that the operational temperature exceeds a certain predetermined temperature that corresponds with a pre-established extent of wear of the set of separable contacts 20, and in response thereto the routines 88 may trigger the generation of an output that is output by the output apparatus 86, such as by providing an input to the trip unit 32 that indicates that the set of separable contacts 20 should be evaluated for wear. For instance, the output might be an instruction to output on a display unit of the circuit interrupter 4 such a message, or the same message may be additionally or alternatively communicated to an enterprise data system so that the notification can be reviewed on more of an institutional level. By way of further example, the output might be an instruction to illuminate a light or to trigger an audible alarm on the circuit interrupter 4 itself that a technician can interpret as being indicative of a need to evaluate the set of separable contacts 24 wear. Furthermore, it is possible that the first indication of an operational temperature that exceeds a predetermined operational temperature will merely trigger further operations in the routine to determine whether the operational temperature remains at a level in excess of the predetermined operational temperature for a predetermined period of time. If it is determined that the excessive operational temperature has existed for the predetermined period of time, this may result in the triggering of the output which indicates the need for further evaluation of the set of separable contacts 20 for possible excessive wear. On the other hand, if the operational temperature is determined at some point in the future to drop below the predetermined operational temperature, this may result in the resetting of the aspect of the routine 88 that evaluates wear. In such a situation, if it is determined at some point in the future the operational temperature of the set of separable contacts 20 exceeds the predetermined temperature, this may again trigger the routines 88 to wait an additional period of time to determine whether the excessive operational temperature has remained for a predetermined period of time and, if so, the output will be triggered.

Still alternatively, the output can simply be in the form of a degree of wear that has been determined to correspond the detected measured temperature or the corresponding operational temperature, or both. For example, a certain predetermined operational temperature of the set of separable contacts may be defined as the point at which the set of separable contacts 20 should be replaced or at least evaluated for wear. And, the definition of such wear might additionally include a duration of time that the set of separable contacts 20 had remained at an operational temperature in excess of the predetermined operational temperature. For example, this predetermined operational temperature with the optional duration of time at or above such temperature might be defined as a 100% wear level on the set of separable contacts 20. As such, the routines 88 may include additional instructions which convert a detected measured temperature and a corresponding retrieved operational temperature of the set of separable contacts 20 into a percentage of wear of the set of separable contacts 20, i.e., 60% wear by way of example. The percentage of wear can be provided as an output to the trip unit 32 or to an institutional data system. Furthermore, and depending upon the operational temperature that has been retrieved from the data tables 92, the data apparatus 42 may output an instruction to the trip unit 32 to trigger a movement of the set of separable contacts 20 from the CLOSED position to the OPEN position to trip the circuit interrupter 4, such as in an extreme situation wherein the wear of the set of separable contacts 20 is so great that it requires tripping of the circuit interrupter 4. Numerous variations can be envisioned.

Figure 4:
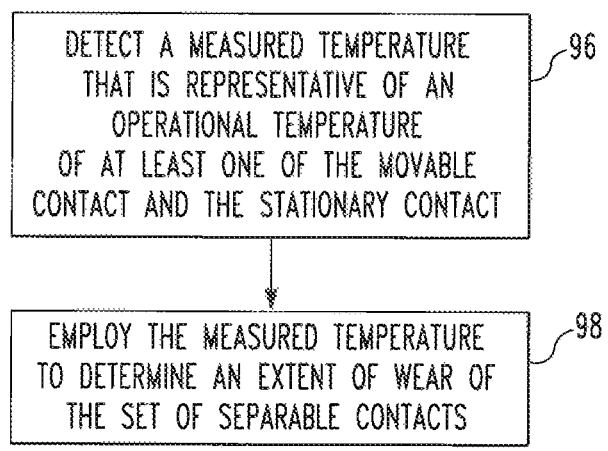
FIG. 4 is a depiction of a flowchart depicting certain aspects of an improved method in accordance with the disclosed and claimed concept.

FIG. 4 depicts in an exemplary fashion a flowchart that demonstrates certain aspects of an improved method in accordance with the disclosed and claimed concept. Processing may begin, as at 96, where a measured temperature is detected that is representative of an operational temperature of at least one of the movable contact 28 and the stationary contact 24 of the set of separable contacts 20. Processing can then continue, as at 98, where the measured temperature is used to retrieve from the data tables 92 a corresponding operational temperature of the set of separable contacts 20 which is then used to determine an extent of wear of the set of separable contacts. In this regard, it is understood that the data tables 92 can include not only a table in which a measured temperature corresponds with an operational temperature of the set of separable contacts 20, but the measured temperature may additionally or alternatively correspond with an extent of wear of the set of separable contacts. Furthermore, data curves and the like may be employed in place of tabular data tables without departing from the spirit of the disclosed and claimed concept.

In the depicted exemplary embodiment, the data apparatus 42 is depicted as being a system that, is separate from the trip unit 32 and that is electrically connected therewith, or is electrically connected with an enterprise data system. It is understood, however, that the trip unit 32 can have resident thereon the various contents of the data apparatus 42 such that the data apparatus 42 need not be provided as a separate structure in the form of a circuit board or the like. In such a situation, the connectors 72 of the sensor apparatuses 40 of the various poles of the circuit interrupter 4 would be connected directly with the trip unit 32, and the trip unit 32 would itself generate the outputs that are provided on the circuit interrupter 4 itself or are output to an enterprise data system, or both. Other variations will be apparent.

Figure 5:
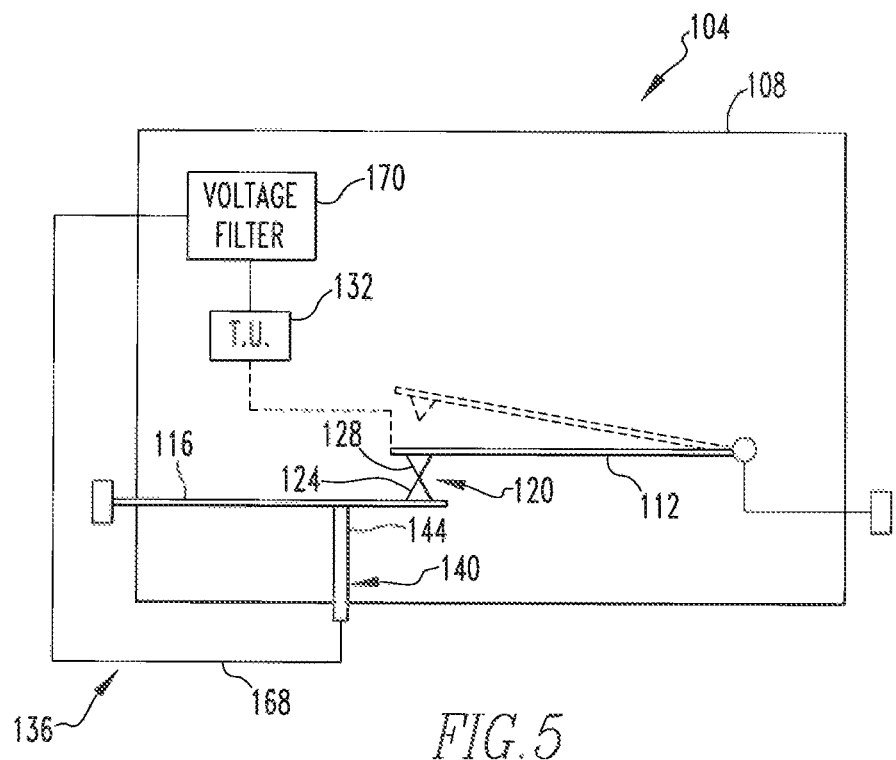
FIG. 5 is a schematic depiction of a circuit interrupter in accordance with a second embodiment of the disclosed and claimed concept.

An improved circuit interrupter 104 in accordance with a second embodiment of the disclosed and claimed concept is depicted generally in FIG. 5. The circuit interrupter 104 is similar to the circuit interrupter 4, except that the circuit interrupter 104 includes a temperature detection system 136 having a temperature sensor 144 in the exemplary form of a thermocouple that is physically in contact with a second conductor 116. That is, the circuit interrupter 104 includes housing 108 upon which a first conductor 112, the second conductor 116, and a set of separable contacts 120 are situated. The set of separable contacts 120 includes a stationary contact 124 and a movable contact 128. A trip unit 132 is operable to move the movable contact 128 from a CLOSED position that is depicted in solid lines in FIG. 5 to an OPEN position that is depicted in dashed lines in FIG. 5.

The temperature detection system 136 includes a sensor apparatus 140 that includes the aforementioned temperature sensor 144 that is in physical contact with the second conductor 116. Due to such physical contact, the temperature sensor 144 is going to be electrified at the line voltage that is experienced by the second conductor 116. As such, the signal that is output by a wire harness 168 that is connected with the temperature sensor 144 includes both a component that is due to the line voltage and another component that is the voltage signal from the temperature sensor 144 that is representative of the measured voltage that has been detected by the temperature sensor 144. As such, the wire harness 168 is advantageously connected with a voltage filter 170 which removes from the signal that is output by the temperature sensor 144 the component of the signal that corresponds with the line voltage from the second conductor 166. This advantageously results in an output signal from the voltage filter 170 which is input to the trip unit 132 and that is representative of the measured temperature of the second conductor 116.

The temperature detection system 136 includes the same processor apparatus, input apparatus, and output apparatus and the like as in the data apparatus 42, whether such structures are incorporated onto a circuit board that includes the temperature sensor 144 or whether such structures are incorporated into the trip unit 132. The temperature detection system 136 thus advantageously enables the temperature sensor 144 to be physically engaged with the second conductor 116 and to be electrified at the line voltage without the line voltage being input to the trip unit 132 inasmuch as the voltage filter 170 is advantageously interposed between the temperature sensor 144 and the trip unit 132. Other variations will be apparent.

Figure 6:
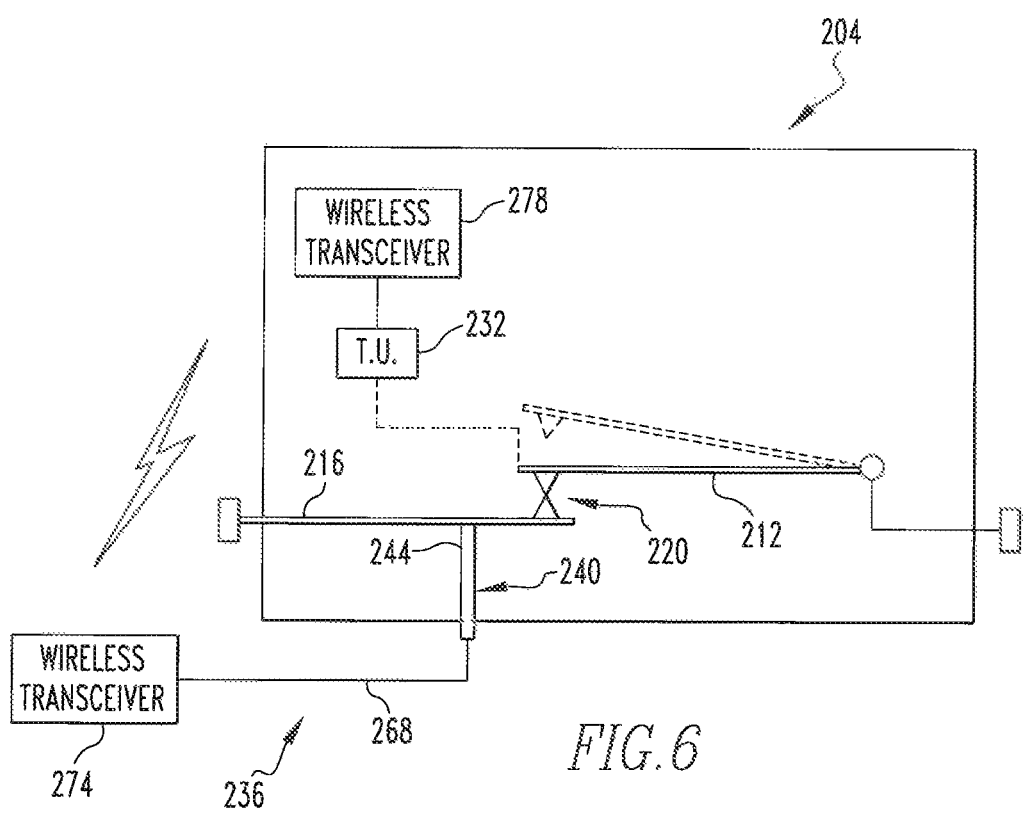
FIG. 6 is a schematic depiction of a circuit interrupter in accordance with a third embodiment of the disclosed and claimed concept.

An improved circuit interrupter 204 in accordance with a third embodiment of the disclosed and claimed concept is depicted generally in FIG. 6. The circuit interrupter 204 is similar to the circuit interrupter 104 in that it includes a temperature detection system 236 having, a temperature sensor 244 that is physically connected with a second conductor 216 of a conductive, path that includes the second conductor 216, a first conductor 212, and a set of separable contacts 220. The temperature detection system 236 includes a sensor apparatus 240 having as the temperature sensor 244 an exemplary thermocouple that is in physical contact with the second conductor 216, and the temperature sensor 244 is thus electrified at the line voltage. However, the temperature sensor 244 includes a wire harness 268 that is electrically connected with a first wireless transceiver 274. The first wireless transceiver 274 is in wireless communication with a second wireless transceiver 278 that is electrically connected with a trip unit 232 that controls operations of the set of separable contacts 220.

The first wireless transceiver 274 wirelessly communicates to the second wireless transceiver 278 a data signal that is representative of the line voltage combined with the voltage signal from the temperature sensor 244. However, since the wireless signal is representative of a value of the voltage that is received through the wire harness 268, and is not the actual voltage itself being applied to the trip unit 232, the trip unit 232 includes instructions as a part of the routines that are resident thereon which ignore or subtract away the portion of the voltage value received from the second wireless transceiver 278 that is representative of the line voltage. That is, the voltage filter 170 is employed in the circuit interrupter 104 since the signal that is being output by the wire harness 168 includes the actual line voltage plus a component that is representative of the measured temperature of the second conductor 116, with the result that such excessive voltage has the potential to damage the trip unit 132, and thus the line voltage is filtered from the signal by the voltage filter 170. Since the line voltage that is provided to the first wireless transceiver 274 from the wire harness 268 is not actually being communicated by the first wireless transceiver 274 to the second wireless transceiver 278, and rather what is being transmitted is a signal that is representative of the magnitude of the voltage that is detected from the wire harness 268, the trip unit 232 includes instructions that enable it to ignore the component of the signal that corresponds with the line voltage. As before, the trip unit 232 can have all of the structures and data processing capability and the like of the data apparatus 42 being incorporated therein, or the temperature detection system 236 can simply include the data apparatus as a separate component from the trip unit 232, depending upon the needs of the particular application.

It is understood that any of a wide variety of temperature sensors can be employed other than those that are expressly described herein. For instance, a resistance temperature diode (RTD) could be used and which would be in physical contact with one of the conductive structures of the electrified circuit that runs through one of the aforementioned circuit interrupters. In such a situation, the RTD typically would be in physical contact with one of the conductive structures, but it could be connected via a pair of wireless transceivers such as are provided in the circuit interrupter 204. Other variations and combinations will be apparent.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter comprising:
a housing;
a first conductor situated on the housing;
a second conductor situated on the housing;

a set of separable contacts that comprise a movable contact electrically connected with the first conductor and a stationary contact electrically connected with the second conductor;

a trip unit connected with the movable contact and structured to move the set of separable contacts between a CLOSED condition and an OPEN condition; and a temperature detection system comprising a temperature sensor that is structured to detect a temperature of at least one of the first conductor, the second conductor, the movable contact, and the stationary contact;

wherein the temperature sensor is in physical contact with the at least one of the first conductor, the second conductor, the movable contact, and the stationary contact;

wherein the circuit interrupter is structured to be connected with a line conductor having a line voltage; and wherein the temperature detection system further comprises a voltage filter that is structured to filter the line voltage from a signal that is output by the temperature sensor.

2. The circuit interrupter of claim 1 wherein the temperature detection system further comprises a processor apparatus comprising a processor and a storage, the storage having stored therein a number of routines which, when executed on the processor, cause the circuit interrupter to perform operations comprising:

making a determination that the temperature has exceeded a predetermined value; and responsive to the making of the determination, generating an output.

3. The circuit interrupter of claim 2 wherein the operations further comprise:

as part of the making of the determination, determining that the temperature has exceeded the predetermined value for a predetermined period of time.

4. The circuit interrupter of claim 2 wherein the further operations comprise generating as the output at least one of an alarm and a notification that is representative of at least one of the temperature and a level of wear of the set of separable contacts.

5. A method of determining an extent of wear of a set of separable contacts of a circuit interrupter, the circuit interrupter further includes a first conductor and a second conductor, the movable contact being electrically connected with the first conductor, the stationary contact being electrically connected with the second conductor, the set of separable contacts being movable between a CLOSED condition and an OPEN condition and including a movable contact and a stationary contact, the method comprising:

detecting a measured temperature that is representative of an operational temperature of at least one of the movable contact and the stationary contact;

detecting as the measured temperature a temperature of at least one of the first conductor, the second conductor, the movable contact, and the stationary contact;

placing the temperature sensor in physical contact with the at least one of the first conductor, the second conductor, the movable contact, and the stationary contact;

employing a voltage filter to filter a line voltage from a signal that is output by the temperature sensor; and employing the measured temperature to determine the extent of wear of the set of separable contacts.

6. The method of claim 5, further comprising:

making a determination that the temperature has exceeded a predetermined value; and responsive to the making of the determination, generating an output.

7. The method of claim 6, further comprising:

as part of the making of the determination, determining that the temperature has exceeded the predetermined value for a predetermined period of time.

8. The method of claim 6, further comprising generating as the output at least one of an alarm and a notification that is representative of the temperature.

9. A circuit interrupter comprising:

a housing;

a first conductor situated on the housing;

a second conductor situated on the housing;

a set of separable contacts that comprise a movable contact electrically connected with the first conductor and a stationary contact electrically connected with the second conductor;

a trip unit connected with the movable contact and structured to move the set of separable contacts between a CLOSED condition and an OPEN condition; and a temperature detection system comprising a temperature sensor and a processor apparatus;

the temperature sensor being structured to detect a temperature of at least one of the first conductor, the second conductor, the movable contact, and the stationary contact;

the processor apparatus comprising a processor and a storage, the storage having stored therein a number of routines which, when executed on the processor, cause the circuit interrupter to perform operations comprising:

making a determination that the temperature has exceeded a predetermined value, detecting as the measured temperature a temperature of at least one of the first conductor, the second conductor, the movable contact, and the stationary contact, placing the temperature sensor in physical contact with the at least one of the first conductor, the second conductor, the movable contact, and the stationary contact, employing a voltage filter to filter a line voltage from a signal that is output by the temperature sensor, and responsive to the making of the determination, generating an output.

10. The circuit interrupter of claim 9 wherein the operations further comprise, as part of the making of the determination, determining that the temperature has exceeded the predetermined value for a predetermined period of time.

11. The circuit interrupter of claim 9 wherein the further operations comprise generating as the output at least one of an alarm and a notification that is representative of at least one of the temperature and a level of wear of the set of separable contacts.

* * * * *